(12) United States Patent
Kammler et al.

(10) Patent No.: US 7,109,086 B2
(45) Date of Patent: Sep. 19, 2006

(54) TECHNIQUE FOR FORMING A SPACER FOR A LINE ELEMENT BY USING AN ETCH STOP LAYER DEPOSITED BY A HIGHLY DIRECTIONAL DEPOSITION TECHNIQUE

(75) Inventors: Thorsten Kammler, Ottendorf-Okrilla (DE); Katja Huy, Dresden (DE); Markus Lenski, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/987,827

(22) Filed: Nov. 12, 2004

(65) Prior Publication Data

US 2005/0142828 A1 Jun. 30, 2005

(30) Foreign Application Priority Data

Dec. 30, 2003 (DE) ............................. 103 61 635

(51) Int. Cl.
*H01L 21/336* (2006.01)
(52) U.S. Cl. .................. 438/303; 438/305; 438/595
(58) Field of Classification Search ............... 438/303, 438/592, 595
See application file for complete search history.

(56) References Cited

U.S. PATENT DOCUMENTS

| | | | |
|---|---|---|---|
| 5,202,277 A * | 4/1993 | Kameyama et al. ......... 438/302 |
| 5,874,331 A * | 2/1999 | Nishigohri ................... 438/231 |
| 6,040,223 A * | 3/2000 | Liu et al. ..................... 438/303 |
| 6,074,919 A | 6/2000 | Gardner et al. ............. 438/287 |
| 6,080,607 A | 6/2000 | Chang et al. ................ 438/151 |
| 6,140,192 A | 10/2000 | Huang et al. ............... 438/305 |
| 6,582,974 B1 * | 6/2003 | Lui et al. ........................ 438/6 |
| 6,737,342 B1 | 5/2004 | Lee et al. .................... 438/591 |
| 2003/0011080 A1 | 1/2003 | Deshpande et al. ......... 257/900 |

OTHER PUBLICATIONS

Schumicki and Seegebrech, "Prozeβtechnologie," Chapter 7.4, pp. 201-203, 1991.

* cited by examiner

*Primary Examiner*—Zandra V. Smith
*Assistant Examiner*—Khanh Duong
(74) *Attorney, Agent, or Firm*—Williams, Morgan & Amerson (57) ABSTRACT

The present invention provides a technique that enables the formation of a recessed spacer element by using an anisotropically deposited etch stop layer. Accordingly, in subsequent cleaning processes, material residues of the etch stop layer may be efficiently removed from upper sidewall portions of a line element, thereby increasing the available area for a diffusion path in a subsequent silicidation process. The anisotropic deposition of the etch stop layer may be accomplished by high density plasma enhanced CVD or by directional sputter techniques.

27 Claims, 5 Drawing Sheets

TECHNIQUE FOR FORMING A SPACER FOR A LINE ELEMENT BY USING AN ETCH STOP LAYER DEPOSITED BY A HIGHLY DIRECTIONAL DEPOSITION TECHNIQUE

BACKGROUND OF THE INVENTION

1. Field of the Invention

The present invention generally relates to the fabrication of integrated circuits, and, more particularly, to the formation of spacer elements used for the fabrication of field effect transistors, wherein the spacer elements may serve as an implantation mask and/or a silicidation mask.

2. Description of the Related Art

Presently, the vast majority of integrated circuits are manufactured on the basis of silicon with critical feature sizes in sophisticated devices on the order of 0.1 μm and even less. The fabrication of transistor elements representing the dominant components of complex circuits, such as microprocessors, storage devices and the like, typically require, among others, a controlled introduction of dopants into precisely defined silicon regions. The MOS circuit architecture, which is currently the preferred technology for forming logic circuitry owing to the superior performance with respect to power consumption, requires the formation of highly doped silicon regions with a weakly counter-doped or substantially undoped channel region disposed therebetween, wherein the conductivity of the channel region is controlled by an electric field generated by applying a control voltage to a gate electrode located in the vicinity of the channel region and separated therefrom by a gate insulation layer. Hence, a reduction in size of the transistor element necessitates the reduction of the distance between the highly doped silicon regions. This distance represents an important design criterion and is also referred to as the "channel length." In currently favored CMOS technologies, the gate electrode is patterned prior to the formation of the highly doped silicon regions, also referred to as "drain region and source region," to obtain the transistor geometry, i.e., the spatial relationship between the gate electrode, the drain region and the source region, in a self-aligned manner. Reducing the channel length therefore also requires a corresponding reduction of the size of the gate electrode. Generally, the gate electrode may be considered, at least partially, as a line-like circuit feature, the width of which is related to the corresponding channel length, which is thus also referred to as "gate length."

Since the formation of the transistor elements, especially the creation of an appropriately shaped dopant profile in the drain and source regions, requires a plurality of high temperature processes for activating the dopants and for partially curing implantation-induced lattice damage, polysilicon is the presently preferred material for the gate electrode due to the superior and well-understood characteristics of the silicon/silicon dioxide interface, as silicon dioxide is frequently used in forming the gate insulation layer which separates the channel region from the gate electrode. Although the provision of the polysilicon gate electrode prior to the formation of the drain and source regions assures a self-aligned transistor geometry, it nevertheless turns out that complex, precisely-defined dopant profiles in the lateral direction are necessary to provide the required transistor performance of extremely scaled transistor devices. For this reason, so-called "sidewall spacers" or, briefly, "spacers" are typically formed on sidewalls of the gate electrode, which may be considered as dielectric extensions of the gate electrode. Hence, the spacers correspondingly modify the lateral dimensions of the gate electrode acting as an implantation mask during the implantation sequences for creating the required dopant profile. Since the dimensions of the sidewall spacers substantially determine the dopant profile obtained after implantation, the necessity for highly complex lateral dopant profiles also calls for advanced spacer formation techniques, in which sophisticated deposition and etch processes have to be applied to achieve the required dopant profile as implanted. Usually, sophisticated MOS transistor devices require the sequential formation of two or more sidewall spacers, whereby, after completion of each respective spacer, an implantation process is performed wherein the respective spacers in combination with the gate electrode serve as temporary implantation masks. Hence, a uniform and reliable spacer technology is required to provide a uniform transistor performance.

Due to the continuous decrease in feature sizes, the channel length and thus the gate length of the transistor devices also have to be decreased, thereby reducing the conductivity of the gate electrode owing to a reduced cross-sectional area and a disproportional increase of dopant depletion in the gate electrode. Moreover, the contact and sheet resistivity of the drain and source regions also increase as feature sizes are scaled down. The reduction in conductivity of the gate electrode and the drain and source regions is typically counteracted by forming a highly conductive metal silicide in the gate electrode and the drain and source regions. During the silicidation process, the sidewall spacers also serve as a reaction mask, enabling a reaction of the metal with underlying silicon material, but substantially preventing a silicide formation within the spacers, thereby assuring a self-aligned silicide formation. In recent developments, the amount of silicide formed in the gate electrode has been increased by recessing the sidewall spacers to expose an increased amount of the surface of the gate electrode, thereby enabling the formation of an increased metal silicide portion. However, recessing the sidewall spacers is accompanied by certain issues, as will be described with reference to FIGS. 1a–1c in more detail.

Figure 1A:
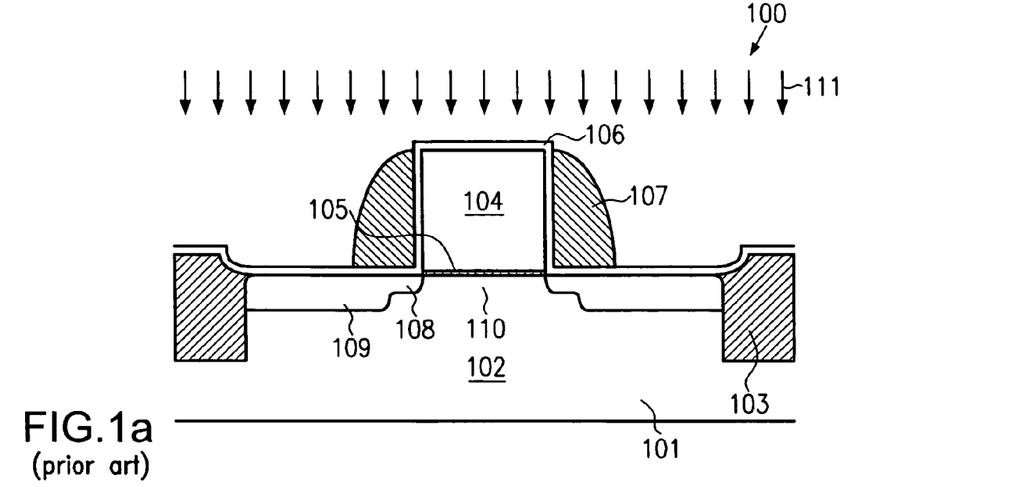
FIGS. 1a–1c schematically show cross-sectional views of a transistor element having recessed spacer elements formed in accordance with a conventional process flow.

FIG. 1a schematically shows a cross-sectional view of a transistor element 100 in an advanced manufacturing stage. The transistor element 100 comprises a substrate 101, which may represent a silicon substrate or a silicon-on-insulator (SOI) substrate having formed thereon a silicon region 102, which is enclosed by an isolation structure 103, for instance provided in the form of a trench isolation structure. The silicon region 102 comprises highly doped drain and source regions, which are represented by an extension region 108 and a corresponding deeply doped region 109, which, for convenience, is referred to as drain region or source region. The drain and source regions 109 and the extension regions 108 are separated in a transistor length direction, i.e., in FIG. 1a in the horizontal direction, by a channel region 110, which is typically lightly doped with a dopant of an opposite conductivity type compared to the extension regions and drain and source regions 108, 109. A gate electrode 104, comprised of polysilicon, is formed above the silicon region 102 and is separated therefrom by a gate insulation layer 105, which may be comprised of silicon dioxide, silicon oxynitride, silicon nitride and the like. Moreover, a silicon dioxide liner 106 is formed on the gate electrode 104 and on surface portions of the silicon region 102, which are not covered by the gate electrode 104. Sidewall spacers 107, comprised of silicon nitride, are shown in an intermediate state during an etch procedure indicated as 111.

A typical process flow for forming the transistor element 100 as shown in FIG. 1a may comprise the following processes. After forming the isolation structure 103 by sophisticated photolithography, etch and deposition techniques, when trench isolations are considered, implantation cycles may be performed to establish a required vertical dopant profile, for instance required for the threshold adjustment and the like, within the silicon region 102. Thereafter, the gate insulation layer 105 and the gate electrode 104 may be formed by, for example, sophisticated oxidation techniques and/or deposition techniques, and by depositing a polysilicon layer by low pressure chemical vapor deposition, respectively, and by subsequently patterning the resulting layer stack by well-established photolithography, trim etch techniques and anisotropic etch processes.

Thereafter, the extension regions 108 may be formed by a corresponding implantation sequence using the gate electrode 104 as an implantation mask. Next, the silicon dioxide liner 106 may be formed by plasma enhanced chemical vapor deposition (PECVD), wherein a thickness of the silicon dioxide liner 106 is selected to serve, in combination with the sidewall spacer 107, as an extension of the gate electrode 104 during a subsequent implantation sequence for forming the drain and source regions 109. The silicon dioxide liner 106 is required as an etch stop layer during the anisotropic etch process 111 for patterning the sidewall spacers 107. Thereafter, a silicon nitride layer is deposited by PECVD, wherein a thickness of the layer substantially determines, in combination with the thickness of the silicon dioxide liner 106, the total width of an implantation mask defined by the gate electrode 104 and the sidewall spacer 107, including the silicon dioxide liner 106.

As previously discussed, the shrinkage of the gate length, i.e., the horizontal extension of the gate electrode 104 in FIG. 1a, and the reduction of the thickness of the gate insulation layer 105 associated therewith requires a thorough profiling of the dopant concentration in the vicinity of the edge of the gate electrode 104 in view of desired high conductivity and with respect to control of the resulting electric field prevailing during the operation of the transistor element 100. Consequently, controlling the thickness of the silicon dioxide liner 106 and of the silicon nitride layer used for forming the sidewall spacers 107 is an important aspect in obtaining substantially uniform transistor characteristics across a single die and across the entire substrate 101. For instance, the formation of a thin conformal layer, such as the silicon dioxide liner 106, may be influenced by the type of pattern to which the transistor element 100 belongs. That is, in substrate areas or die areas of high pattern density, i.e., with a high number of gate electrodes per unit area, the deposition kinetics may be different from die or substrate areas having formed thereon substantially isolated gate electrodes, i.e., gate electrodes spaced apart from neighboring line elements by a distance that is many times the gate length. For this reason and owing to typical global across-substrate thickness variations in the deposition process of approximately 1.5% across the entire substrate area, the transistor performance may vary accordingly, as the dopant profiles 108 and 109 may exhibit a corresponding variation owing to a varying width of the implantation mask, i.e., the gate electrode 104 plus the spacer 107 and the liner 106, during the implantation processes.

After depositing the silicon nitride layer, the anisotropic etch process 111 is performed to remove excess material, thereby forming the sidewall spacers 107. During the etch process 111, the silicon dioxide liner 106 protects horizontal device portions exposed to the etch front of the plasma etch process 111. As previously discussed, in later manufacturing stages, a metal silicide is formed in the gate electrode 104 and the drain and source regions 109. Since a size reduction of the gate electrode 104 is typically associated with a reduction of conductivity, it is desirable to convert as much of the polysilicon into a highly conductive metal silicide as possible, thereby compensating the reduced cross-sectional area and the enhanced dopant depletion in the gate electrode 104. Consequently, in sophisticated transistor devices, the anisotropic etch process 111 is continued to expose an upper sidewall portion of the gate electrode 104, which may then serve as an increased diffusion path during the conversion of silicon into metal silicide.

Figure 1B:
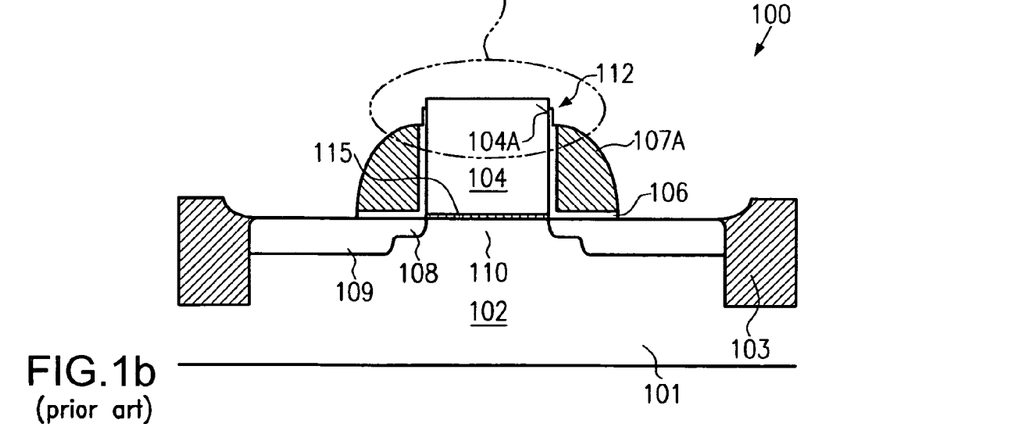

FIG. 1b schematically shows the device 100 after completion of the anisotropic etch process 111, thereby forming a recessed sidewall spacer 107a. Moreover, exposed portions of the silicon dioxide liner 106 are substantially removed, at least from horizontal surface portions, while residues 112 of the silicon dioxide liner 106 may still be present at upper sidewall portions 104a of the gate electrode 104, exposed by the recessed sidewall spacers 107a.

In a typical conventional process flow, the silicon dioxide liner 106 is removed by a wet chemical process, for instance using (diluted) hydrofluoric acid (HF), followed by a sputter cleaning process prior to the sputter deposition of a refractory metal. However, owing to the highly directional nature of the sputter cleaning process, the silicon dioxide liner 106 may not be completely removed prior to the subsequent metal deposition. Consequently, the residues 112 may block a certain area of diffusion paths during a chemical reaction between the refractory metal and the polysilicon of the gate electrode 104.

Figure 1C:
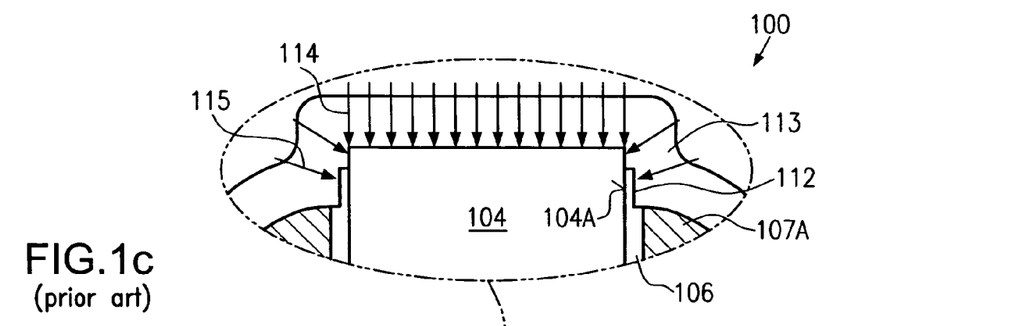

FIG. 1c schematically shows the situation during the formation of metal silicide on top of the gate electrode 104 in more detail. A layer 113 comprised of a refractory metal, such as cobalt, nickel and the like, is formed over the gate electrode 104, and, according to a typical process flow, over the drain and source regions 109, wherein substantially non-hindered diffusion paths 114 are provided for the refractory metal of the layer 113, while at locations including the oxide residues 112, diffusion paths 115 are substantially blocked for the conversion of the refractory metal in the layer 113 into a highly conductive metal silicide. Consequently, the amount of metal silicide, and thus the finally achieved conductivity of the gate electrode 104, is reduced compared to that which is intended by providing the recessed spacers 107a. Hence, further device scaling may be accompanied by a reduced gain of transistor performance owing to the reduced gate conductivity and thickness variations of the oxide liner 106 used for patterning the spacers 107a.

In view of the above-explained situation, there exists a need for an improved technique for forming recessed sidewalls spacers that enables enhancement of the conductivity of the gate electrode while maintaining a high degree of compatibility with the conventional process flow.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment of the present invention, a method comprises forming a line element above a semiconductor layer, wherein the line element has a top surface, a first sidewall and a second sidewall. Then, an etch stop layer is directionally deposited over the line element and the semiconductor layer to cover the top surface and the semiconductor layer with a desired thickness while producing a reduced thickness on the first and second sidewalls. Moreover, a spacer layer is deposited over the etch stop layer and the spacer layer is then anisotropically etched to form a spacer element while using the etch stop layer formed on the top surface of the line element and on the semiconductor layer to control the anisotropic etching.

According to another illustrative embodiment of the present invention, a method comprises forming a line element above a semiconductor layer, wherein the line element has a top surface, a first sidewall and a second sidewall. Then, an etch stop layer is directionally deposited over the line element and the semiconductor layer to cover the top surface and the semiconductor layer with a desired thickness while maintaining the first and second sidewalls substantially exposed. Moreover, a spacer layer is deposited over the etch stop layer and the spacer layer is then anisotropically etched to form a spacer element while using the etch stop layer formed on the top surface of the line element and on the semiconductor layer to control the anisotropic etching.

According to yet another illustrative embodiment of the present invention, a transistor comprises a gate electrode structure formed above a semiconductor layer and having a top surface and sidewalls. A first liner having a first thickness is formed on a lower portion of the sidewalls. A second liner having a second thickness greater than the first thickness is formed on a portion of the semiconductor layer adjacent to the gate electrode structure. A spacer element is formed adjacent to the first and second liners.

According to a further illustrative embodiment of the present invention, a transistor comprises a gate electrode structure formed above a semiconductor layer and having a top surface and a sidewall. A liner is formed on a portion of the semiconductor layer. A spacer element is formed on the liner, wherein the liner is in contact with the sidewall.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously explained, the present invention is based on the concept that the anisotropic etch process for patterning sidewall spacer elements requires a reliable protection of the horizontal surface portions only, while vertical sidewall portions of a line element, such as a gate electrode, may either receive substantially no etch stop layer or an etch stop layer of a significantly reduced thickness compared to the horizontal portions, thereby enabling the material removal of the etch stop layer from the vertical portions in a most efficient fashion, even if at least partially, highly directive cleaning processes are used. Since highly directional deposition techniques are established in the art, any appropriate process recipes may be advantageously used in practicing the present invention, thereby providing a high degree of compatibility with presently established process technologies. For instance, high density plasma enhanced CVD techniques may be used to produce a material layer over a patterned surface, wherein process parameters, such as high frequency power and/or bias power, gas pressure and the like, may be selected to significantly reduce a step coverage. Contrary thereto, in accordance with conventional teaching, the step coverage is maintained at a high level to provide a substantially conformal liner oxide prior to the formation of silicon nitride spacer elements. Another well known deposition technique offering a highly directional particle deposition on patterned surfaces is sputter deposition, wherein a process pressure and/or plasma density and/or bias voltage may be adjusted to obtain a significantly reduced deposition rate at vertical substrate portions compared to horizontal substrate portions. In this respect, it is to be noted that the terms "vertical" and "horizontal" are meant to represent a direction with respect to a substrate surface, wherein "horizontal" indicates a direction substantially parallel to the substrate surface, while "vertical" indicates a direction substantially perpendicular to the substrate surface. The above-explained concept will now be described in more detail with reference to further illustrative embodiments depicted in FIGS. 2a–2d and FIGS. 3a–3d.

Figure 2A:
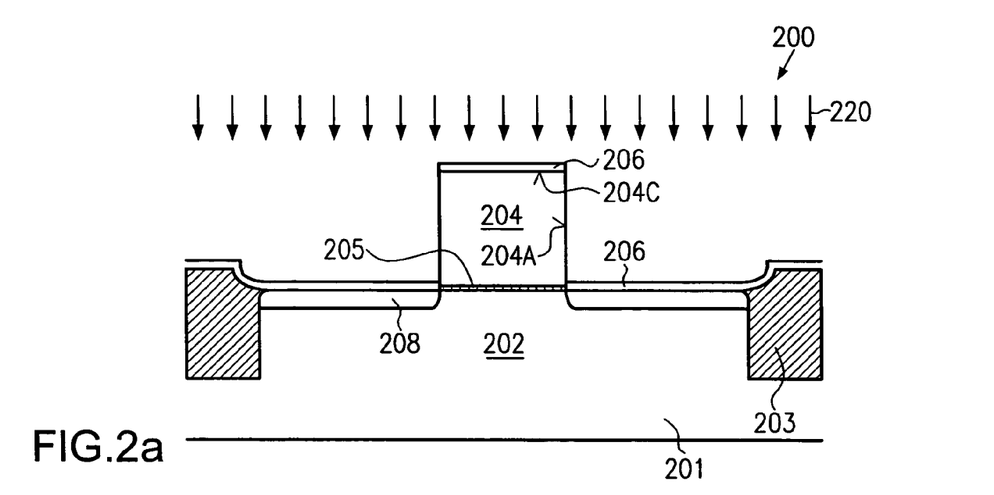
FIGS. 2a–2d schematically depict cross-sectional views of a transistor element with a recessed spacer element formed by means of a directionally deposited etch stop layer according to illustrative embodiments of the present invention.

In FIG. 2a, a semiconductor device 200 comprises a substrate 201 having formed thereon a semiconductor region 202. The semiconductor region 202 may represent a silicon region, as currently most of the complex integrated circuits are manufactured on the basis of crystalline silicon. In other cases, the semiconductor region 202 may be comprised of silicon/germanium, silicon/carbon, or any other semiconductor compounds such as II–VI or III–V semiconductors. It should be noted that the present invention is particularly advantageous in combination with silicon-based semiconductors, since in this case typically recessed sidewall spacers are formed to increase a surface area for initiating a chemical reaction with a refractory metal. However, in other semiconductor architectures, it may also be useful to expose vertical wall portions of a line feature having formed thereon spacer elements, so that the concept of the present invention is also advantageously applicable in these cases. Accordingly, the present invention should not be considered as being restricted to silicon-based semiconductors unless such limitations are explicitly recited in the appended claims.

The semiconductor region 202 is enclosed by an isolation structure 203, for instance provided in the form of a trench isolation structure, wherein the isolation structure 203 may substantially completely insulate the region 202 from neighboring circuit elements, as is the case in, for instance, SOI devices. Above the semiconductor region 202, a line element 204 is formed of an appropriate material, wherein, as previously explained, polysilicon is frequently used as material for silicon-based semiconductor devices due to the superior characteristics of silicon formed on silicon dioxide and the like, which may represent a typical material for a gate insulation layer 205, electrically insulating the line element 204 from the underlying semiconductor region 202. The line element 204, which for convenience may also be referred to as a gate electrode when the semiconductor device 200 is to represent a field effect transistor, may be comprised of any other appropriate material that exhibits a sufficient thermal stability for further processing of the device 200. As previously explained with reference to FIG. 1a, the gate insulation layer 205 may be comprised of silicon dioxide, silicon oxynitride, silicon nitride and the like in silicon-based semiconductor devices, or may be comprised of one or more materials meeting the required reliability and permittivity criteria. Extension regions 208 may be formed in the semiconductor layer 202. An etch stop layer 206, which may in one embodiment be comprised of silicon dioxide, is deposited on the semiconductor region 202 and on a top surface 204c of the gate electrode 204, while sidewalls 204a of the gate electrode 204 are, in one particular embodiment, substantially devoid of material of the etch stop layer 206, or in other embodiments the sidewalls 204a have formed thereon the etch stop layer 206 (not shown) with a significantly reduced thickness compared to the thickness at the top surface 204c. For example, the semiconductor device 200 may represent a transistor element having a gate length of 0.1 µm or even less. In this case, a thickness of the etch stop layer 206 at the top surface 204c may be in the range of approximately 5–20 nm, whereas a layer thickness on the sidewalls 204a is significantly lower, and is, in one particular embodiment, approximately 1 nm or even less.

A typical process flow for forming the isolation structure 203, the gate electrode 204 and the gate insulation layer 205 may substantially comprise the processes as are described with reference to FIG. 1a when silicon-based semiconductor devices are considered. In other cases, well-established process techniques may be applied to form the device 200 based on other semiconductor materials. Moreover, when the device 200 is to represent a transistor, corresponding implantation sequences may be preformed to generate the required vertical dopant profile and the extension regions, as is described with reference to FIG. 1a. Thereafter, a highly directional deposition technique, indicated by 220, is performed to deposit the etch stop layer 206, for instance in the form of silicon dioxide, preferably on horizontal portions with a required thickness while providing merely a reduced material amount on the sidewalls 204a or depositing substantially no material on the sidewalls 204a. Hence, contrary to the conventional highly conformal deposition process for forming the silicon dioxide liner 106 (FIG. 1a), according to the present invention, process parameters, for instance in a plasma enhanced CVD process, are adjusted to increase the anisotropy within the plasma atmosphere, for example by using a moderately high plasma density and a moderately high bias voltage between the plasma and the substrate 201 to reduce a particle-to-particle interaction during the migration of ionized molecules or atoms towards the substrate surface. For instance, silicon dioxide may be deposited from TEOS or silane in typical CVD reactors including capacitive or inductive high frequency coupling means to provide high frequency power and bias power to the precursor gases within a reaction chamber. Since the step coverage, i.e., the ratio of thickness deposited on a horizontal surface portion, such as the top surface 204c, to the thickness deposited on a vertical portion, such as the sidewall 204a, is well known for a plurality of deposition recipes, a corresponding set of process parameters may be readily selected from these process recipes or may be established on the basis of test runs to obtain process parameters providing a uniform layer thickness on horizontal portions while providing a deposition rate of approximately zero or a significantly reduced deposition rate on the sidewalls 204a.

In other embodiments, a physical vapor deposition technique, such as sputter deposition, may be used, wherein process parameters such as pressure, bias voltage, target-substrate distance and the like are selected to obtain a highly directional deposition of the etch stop layer 206. Corresponding recipes are well known in the art or may be readily established.

Moreover, the etch stop layer 206 represents any appropriate material layer that exhibits a required reduced etch rate with respect to a specified etch recipe used in patterning a spacer layer. For example, in one embodiment, the etch stop layer 206 is deposited in the form of a silicon nitride based layer by a highly directional plasma enhanced CVD process, or by a correspondingly designed sputter deposition process. Corresponding process recipes are also well established in the art and may be readily applied to the formation of the etch stop layer 206, thereby obtaining substantially exposed sidewalls 204a or at least a reduced layer thickness at the sidewalls 204a.

Figure 2B:
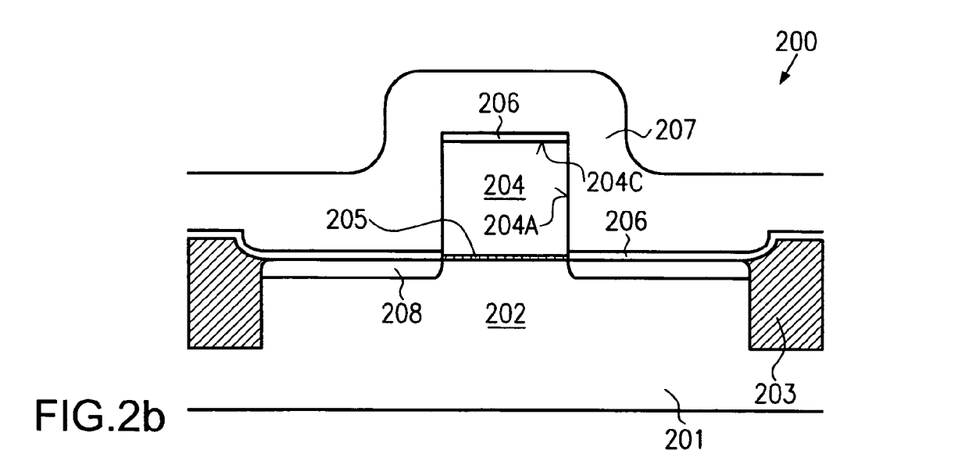

FIG. 2b schematically shows the device 200 in a further advanced manufacturing stage. Moreover, a spacer layer 207 is formed over the gate electrode 204 and the semiconductor region 202. The spacer layer 207 may be comprised of any appropriate material that exhibits a sufficient etch selectivity to the material of the etch stop layer 206. For instance, when the etch stop layer 206 is substantially comprised of silicon dioxide, the spacer layer 207 may be comprised of silicon nitride, which may include amounts of hydrogen, oxygen and the like. In other embodiments, the etch stop layer 206 may be comprised of silicon nitride, including, for instance, hydrogen, oxygen and the like, and the spacer layer 207 may be comprised of silicon dioxide. The combination of silicon dioxide and a silicon nitride based material to form a layer stack including an etch stop layer and a spacer layer or vice versa is advantageous in that corresponding selective etch recipes are well established in the art. It should be noted, however, that any other material combination may be used as long as the materials exhibit a sufficient selectivity and also offer a thermal stability, as is required for further processing of the device 200. A thickness of the spacer layer 207 is selected in conformity with process requirements, that is, the thickness is selected to correspond to the desired width of spacer elements to be formed from the spacer layer 207.

A typical process flow may comprise an implantation sequence, when, according to some embodiments, the extension regions 208 are formed after the formation of the etch stop layer 206, wherein the etch stop layer 206 may then act as a screening layer to reduce channeling effects in the formation of the extension regions 208. Thereafter, the spacer layer 207 may be formed in accordance with well established process techniques, such as plasma enhanced CVD, sputter deposition and the like, as is also described with reference to FIG. 1a. Afterwards, a selective anisotropic etch process is performed to pattern the spacer layer 207 to form sidewall spacers. During the anisotropic and highly directional etch process, surface portions of the extension regions 208 are reliably protected by the etch stop layer 206 during a final phase of the etch process, similar to the top surface 204c of the gate electrode 204, whereas the sidewall portions 204a of the gate electrode 204 are only negligibly damaged by the highly directional etch process. As previously discussed, the anisotropic etch process may be continued to expose upper sidewall portions of the gate electrode 204 to a degree as is demanded by process requirements. Next, the etch stop layer 206 is removed by, for example, a wet chemical etch process followed by a directional sputter cleaning process prior to the deposition of a refractory metal, as is also explained with reference to FIG. 1b in the conventional process flow.

Figure 2C:
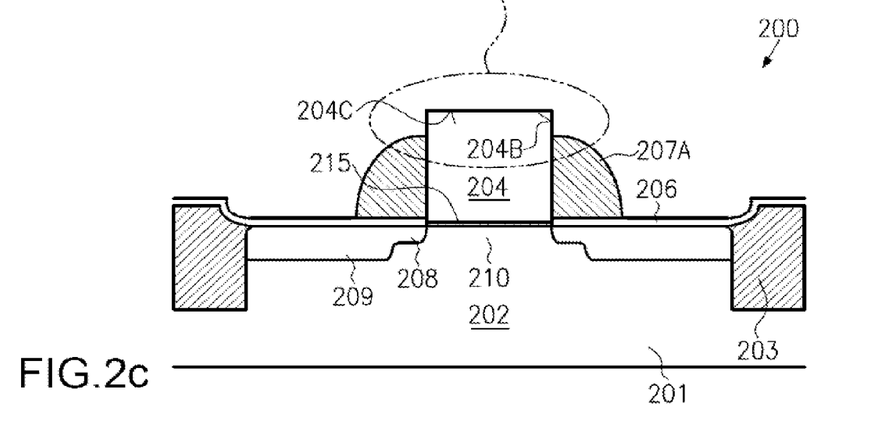

FIG. 2c schematically shows the semiconductor device 200 after completion of the above-described processes, wherein recessed spacers 207a are formed adjacent to the sidewalls 204a with an upper sidewall portion 204b exposed and substantially free from residues of material of the etch stop layer 206 due to the significantly reduced thickness or a lack of material after the directional deposition of the etch stop layer 206. Moreover, horizontal surface portions of the semiconductor region 202 and the top surface 204c of the gate electrode 204 are exposed by the preceding wet chemical and directional cleaning processes. Furthermore, drain and source regions 209 have been formed by ion implantation, wherein the recessed spacers 207a have been used as an implantation mask, with the width of the recessed spacers 207a being substantially determined by the initial layer thickness of the spacer layer 207. Contrary to the conventional process, the width of the spacers 207a is substantially not affected by the deposition process for forming the etch stop layer 206. Consequently, as previously explained, the influence of microloading of the deposition process in forming thin layers, such as the etch stop layer 206, may be substantially prevented or at least significantly reduced, thereby achieving an enhanced process stability and thus an enhanced uniformity of device performance, as the dopant profile for the drain and source regions 209 is less prone to variations in pattern density within a die or a substrate area.

After the implantation for forming the drain and source regions 209, corresponding anneal cycles may be performed to activate the dopants and to cure, at least partially, implantation-induced crystalline damage.

Figure 2D:
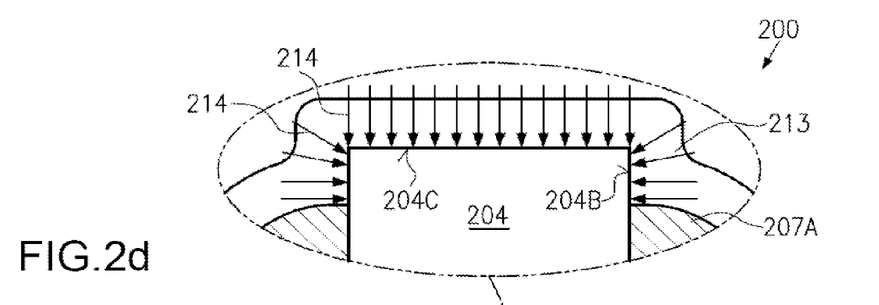

FIG. 2d schematically shows a portion of the semiconductor device 200 in more detail, wherein a layer of refractory metal 213 is formed over the device 200, which is to be converted into a highly conductive metal compound with the material of the gate electrode, for instance into a metal silicide, whereby, contrary to the conventional process, diffusion paths 214 are provided on top of the gate electrode 204 and also at the exposed sidewall portions 204b, thereby significantly enhancing the chemical reaction between the refractory metal 213 and the gate electrode material. Thus, for extremely scaled gate electrodes 204, the reduction of conductivity may be more effectively compensated for by an increased surface area that is available for reacting with the refractory metal 213 when compared to the conventional process flow, which suffers from significant liner oxide residues during the metal diffusion. Moreover, the highly directional deposition renders the semiconductor device 200 less sensitive to microloading effects.

It should be noted that the embodiments described with reference to FIGS. 2a–2d may be readily applied to other process strategies for forming sidewall spacers on line elements, such as gate electrodes of transistor elements. For instance, a plurality of spacer elements may be required to appropriately shape the dopant profile in the drain and source regions. With reference to FIGS. 3a–3d, further embodiments in this respect will now be described in more detail.

Figure 3A:
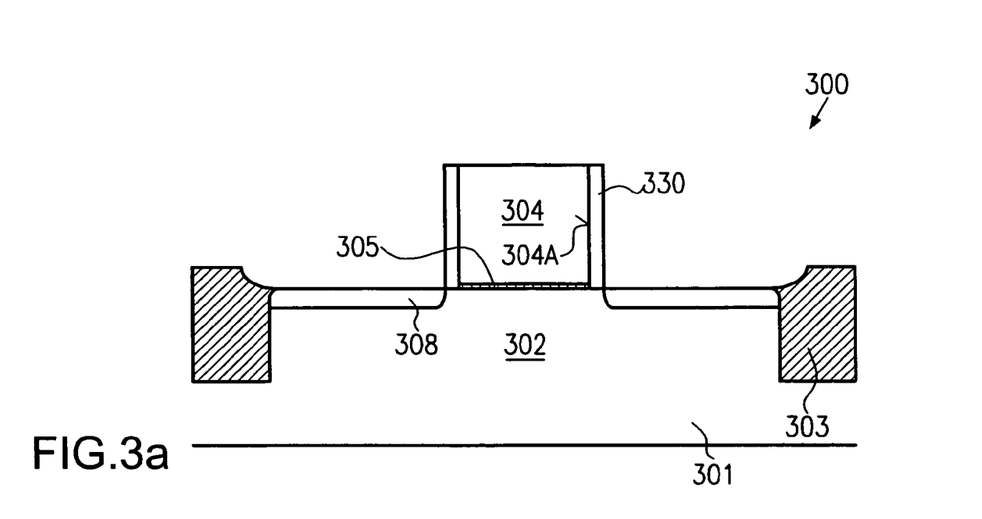
FIGS. 3a–3d schematically show cross-sectional views of a transistor element during various manufacturing stages in accordance with still further illustrative embodiments of the present invention.

FIG. 3a schematically shows a semiconductor device 300 comprising a substrate 301 and an isolation structure 303 enclosing a semiconductor region 302 having formed therein extension regions 308. A gate electrode 304 is formed above the semiconductor region 302 and is separated therefrom by a gate insulation layer 305. Offset spacers 330 are formed on sidewalls 304a of the gate electrode 304. The offset spacers 330 may, for instance, be comprised of silicon dioxide with a desired thickness to form the extension regions 308 with a desired offset to the edge of the gate electrode 304. The offset spacers 330 may, of course, be comprised of other materials, such as silicon nitride, as long as it may be selectively etched with respect to the material of the semiconductor region 302 and the gate electrode 304. The offset spacer 330 may be formed by well established isotropic, i.e., conformal plasma enhanced CVD techniques and subsequent anisotropic etch processes, to remove the excess material from horizontal surface portions. Thereafter, the offset spacers 330 may be removed by any appropriate selective etch process, such as wet chemical etch process on the basis of (diluted) hydrofluoric acid (HF) or hot phosphoric acid when the offset spacers 330 are comprised of silicon dioxide or silicon nitride, respectively. By means of the selective etch process, the sidewalls 304a are substantially completely exposed and further processing may be resumed similarly to the process flow described with reference to FIGS. 2a and 2b.

Figure 3B:
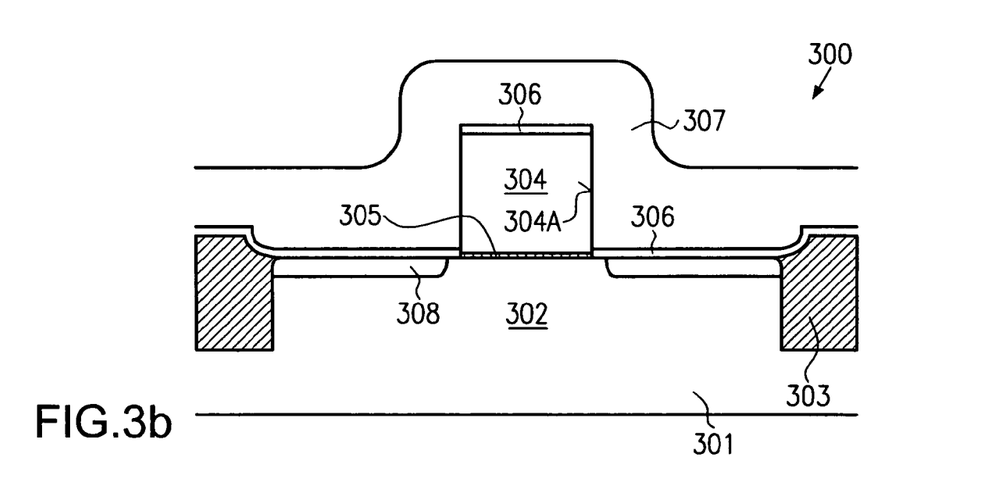

FIG. 3b schematically shows the semiconductor device 300 having formed thereon an etch stop layer 306 covering horizontal surface portions while substantially exposing the sidewall portions 304a of the gate electrode 304, or at least having a reduced thickness. Moreover, a spacer layer 307 is formed conformally over the substrate 301 with a thickness in conformity with process requirements. Regarding the material composition of the etch stop layer 306 and the spacer layer 307, the same criteria apply as previously explained with reference to FIG. 2b. Moreover, the same process techniques may be applied in forming the etch stop layer 306, as has been previously discussed, to obtain a substantially non-conformal deposition of the etch stop layer 306.

Figure 3C:
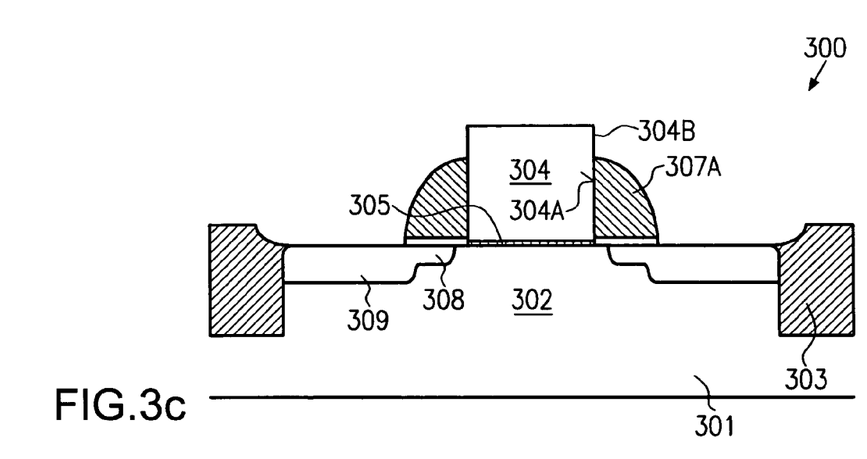

FIG. 3c schematically shows the device 300 after anisotropically etching the spacer layer 307 to form recessed spacers 307a exposing upper portions 304b of the gate electrode 304, while the etch stop layer 306 is removed from the horizontal surface portions. Moreover, deeply doped drain and source regions 309 are formed adjacent to the extension regions 308.

The drain and source regions 309 may be formed by ion implantation using the sidewall spacers 307a as an implantation mask, as is also described with reference to FIG. 2c. After a highly effective removal of any material residues of the etch stop layer 306 by isotropic and anisotropic cleaning processes, the device 300 may receive a refractory metal layer to increase the conductivity of the gate electrode 304 and of the drain and source regions 309, as is also described with reference to FIG. 2d.

Figure 3D:
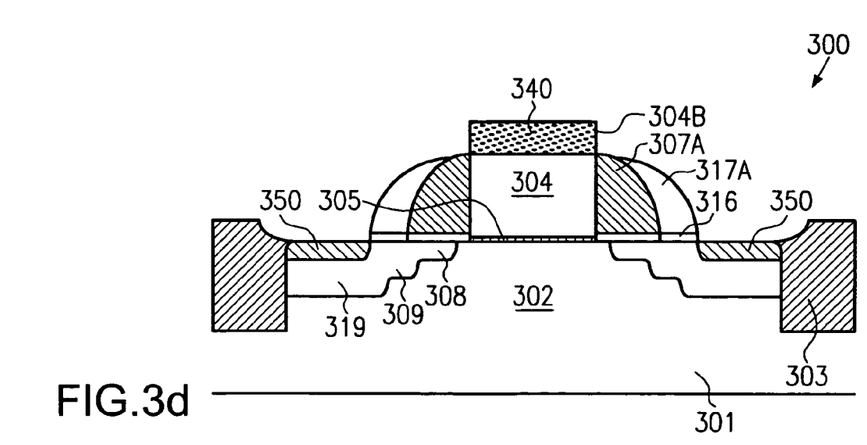

FIG. 3d schematically shows a further illustrative embodiment in which the dopant profile in the regions 308, 309 may not be considered appropriate for the transistor device 300, and a further implantation sequence may be necessary to obtain the desired device performance. To this end, the sequence described with respect to FIG. 3b may be repeated, i.e., an etch stop layer 316, such as the layer 306, may be deposited in a highly directional manner followed by the deposition of a corresponding spacer layer having a desired thickness, which is then patterned to form a second recessed sidewall spacer 317a. By means of the second spacer 317a, a further deeply doped region 319 may be formed that, in combination with the region 309, finally defines the source and drain regions of the device 300. Thereafter, corresponding clean processes may be performed, for instance including a wet chemical etch process and a highly directional sputter cleaning process, to remove residues of the etch stop layer 316 used for forming the second spacers 317a. Since the upper sidewall portions 304b (FIG. 3c) remain substantially uncovered due to the highly directional deposition technique of the present invention in forming the etch stop layers 306, 316, the sidewall portions 304b are substantially completely exposed during the cleaning process. As a consequence, after the subsequent deposition of the refractory metal, the chemical reaction encounters an increased area of diffusion paths even in the multi-spacer approach described above, thereby enabling the formation of an increased amount of metal compound 340 in the gate electrode 304. Simultaneously, corresponding metal compound regions 350 may be formed in the regions 309 and 319. Consequently, the technique of a highly directional deposition of an etch stop layer in forming recessed sidewall spacers may also be advantageously applied to process techniques requiring the formation of two or more sidewall spacers.

As a result, the present invention enables the formation of recessed spacer elements by depositing an etch stop layer used for anisotropically etching a spacer layer in a highly directional fashion to substantially avoid or reduce a material deposition on sidewalls of line elements, such as a gate electrode of a field effect transistor. Consequently, clean processes including highly directional sputter cleaning processes in accordance with conventional process strategies are then efficient in exposing an upper sidewall portion of the line element due to the significantly reduced material deposition during the formation of the etch stop layer. Consequently, an enhanced area for metal diffusion is provided and the sensitivity to microloading effects during the deposition of a thin etch stop layer is significantly relaxed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

That invention claimed is:

1. A method, comprising:
   forming a line element having a top surface and a first sidewall and a second sidewall above a semiconductor layer;
   directionally depositing an etch stop layer over said line element and said semiconductor layer to cover said top surface and said semiconductor layer with a desired thickness while producing a reduced thickness portion of said etch stop layer on substantially the entire said first and second sidewalls;
   depositing a spacer layer over said etch stop layer; and
   anisotropically etching said spacer layer to form a spacer element while using said etch stop layer formed on said top surface of said line element and said semiconductor layer to control the anisotropic etching.

2. The method of claim 1, wherein the directional deposition is performed by a plasma enhanced chemical vapor deposition process.

3. The method of claim 1, wherein the directional deposition is performed by a directional sputter deposition process.

4. The method of claim 1, wherein said anisotropic etching is continued to expose an upper portion of said first and second sidewalls.

5. The method of claim 1, further comprising forming an offset spacer element on said first and second sidewalls and removing said offset spacer element prior to forming said spacer element.

6. The method of claim 1, wherein said etch stop layer is comprised of silicon dioxide.

7. The method of claim 6, wherein said spacer layer is comprised of silicon nitride.

8. The method of claim 1, wherein said etch stop layer is comprised of silicon nitride.

9. The method of claim 8, wherein said spacer layer is comprised of silicon dioxide.

10. The method of claim 3, further comprising forming a second etch stop layer on said top surface and exposed portions of said semiconductor layer, said second etch stop layer being formed by a directional deposition technique.

11. The method of claim 10, further comprising forming a second spacer layer over said second etch stop layer and anisotropically etching said second spacer layer until said second spacer layer is substantially removed from an upper sidewall portion of said line element.

12. The method of claim 1, further comprising creating a specified dopant profile below and adjacent to said spacer element by ion implantation.

13. The method of claim 1, further comprising removing material residues from upper sidewall portions of the first and second sidewalls, depositing a refractory metal over said line element and exposed portions of said semiconductor layer and heat treating said refractory metal to initiate a chemical reaction with said line element and said exposed portions of said semiconductor layer.

14. A method, comprising:
  forming a line element having a top surface and a first sidewall and a second sidewall above a semiconductor layer;
  directionally depositing an etch stop layer over said line element and said semiconductor layer to cover said top surface and said semiconductor layer with a desired thickness while maintaining said first and second sidewalls substantially exposed;
  depositing a spacer layer over said etch stop layer; and
  anisotropically etching said spacer layer to form a spacer element while using said etch stop layer formed on said top surface of said line element and said semiconductor layer to control the anisotropic etching.

15. The method of claim 14, wherein the directional deposition is performed by a plasma enhanced chemical vapor deposition process.

16. The method of claim 14, wherein the directional deposition is performed by a directional sputter deposition process.

17. The method of claim 14, wherein said anisotropic etching is continued to expose an upper portion of said first and second sidewalls.

18. The method of claim 14, further comprising forming an offset spacer element on said first and second sidewalls and removing said offset spacer element prior to forming said spacer element.

19. The method of claim 14, wherein said spacer element is comprised of at least one of silicon nitride and silicon dioxide.

20. The method of claim 14, wherein said etch stop layer is comprised of silicon dioxide.

21. The method of claim 20, wherein said spacer layer is comprised of silicon nitride.

22. The method of claim 14, wherein said etch stop layer is comprised of silicon nitride.

23. The method of claim 22, wherein said spacer layer is comprised of silicon dioxide.

24. The method of claim 16, further comprising forming a second etch stop layer on said top surface and exposed portions of said semiconductor layer, said second etch stop layer being formed by a directional deposition technique.

25. The method of claim 24, further comprising forming a second spacer layer over said second etch stop layer and anisotropically etching said second spacer layer until said second spacer layer is substantially removed from an upper sidewall portion of said line element.

26. The method of claim 14, further comprising creating a specified dopant profile below and adjacent to said spacer element by ion implantation.

27. The method of claim 14, further comprising removing material residues from upper sidewall portions of the first and second sidewalls, depositing a refractory metal over said line element and exposed portions of said semiconductor layer and heat-treating said refractory metal to initiate a chemical reaction with said line element and said exposed portions of the semiconductor layer.

* * * * *